US012351910B2

United States Patent
Fenwick et al.

(10) Patent No.: US 12,351,910 B2
(45) Date of Patent: Jul. 8, 2025

(54) HAFNIUM ALUMINUM OXIDE COATINGS DEPOSITED BY ATOMIC LAYER DEPOSITION

(71) Applicant: APPLIED MATERIALS, INC., Santa Clara, CA (US)

(72) Inventors: David Fenwick, Los Altos, CA (US); Jennifer Y. Sun, Fremont, CA (US); Cheng-Hsuan Chou, Santa Clara, CA (US); Xiao Ming He, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 370 days.

(21) Appl. No.: 17/072,301

(22) Filed: Oct. 16, 2020

(65) Prior Publication Data

US 2021/0123143 A1 Apr. 29, 2021

Related U.S. Application Data

(60) Provisional application No. 62/924,938, filed on Oct. 23, 2019.

(51) Int. Cl.
*C23C 16/40* (2006.01)
*C23C 16/455* (2006.01)
(Continued)

(52) U.S. Cl.
CPC ........ *C23C 16/45536* (2013.01); *C23C 16/40* (2013.01); *C23C 16/45529* (2013.01);
(Continued)

(58) Field of Classification Search
CPC ............... C23C 16/40; C23C 16/4404; C23C 16/45529; C23C 16/45531;
(Continued)

(56) References Cited

U.S. PATENT DOCUMENTS

| 7,135,421 B2 | 11/2006 | Ahn et al. |
| 2004/0023516 A1* | 2/2004 | Londergan ........ H01L 21/02189 438/785 |

(Continued)

FOREIGN PATENT DOCUMENTS

| CN | 1203527 C | 5/2005 |
| CN | 106835066 A | 6/2017 |

(Continued)

OTHER PUBLICATIONS

International Search Report and Written Opinion for PCT/US2020/056883 mailed Feb. 16, 2021, 11 pages.

(Continued)

*Primary Examiner* — Humera N. Sheikh
(74) *Attorney, Agent, or Firm* — Lowenstein Sandler LLP

(57) ABSTRACT

Embodiments of the present disclosure relate to articles, coated articles, and methods of coating such articles with a corrosion resistant coating. The corrosion resistant coating can comprise hafnium aluminum oxide. The corrosion resistant coating may be deposited by a non-line of sight deposition, such as atomic layer deposition. Articles that may be coated may include chamber components, such as gas lines.

11 Claims, 7 Drawing Sheets

(51) Int. Cl.
*C23C 16/505* (2006.01)
*C23F 11/02* (2006.01)
*C23F 11/18* (2006.01)

(52) U.S. Cl.
CPC .. *C23C 16/45553* (2013.01); *C23C 16/45565* (2013.01); *C23C 16/505* (2013.01)

(58) Field of Classification Search
CPC ........ C23C 16/45536; C23C 16/45553; C23C 16/45555; C23C 16/505; H01J 37/32477; H01J 37/32495
See application file for complete search history.

(56) References Cited

U.S. PATENT DOCUMENTS

| | | | | |
|---|---|---|---|---|
| 2005/0023624 | A1* | 2/2005 | Ahn | .................. H01L 21/28194 257/410 |
| 2017/0314125 | A1* | 11/2017 | Fenwick | ............. C23C 16/4404 |
| 2018/0094358 | A1* | 4/2018 | Sammelselg | .......... C25D 11/06 |
| 2019/0271076 | A1 | 9/2019 | Fenwick et al. | |
| 2019/0284686 | A1 | 9/2019 | Melnik et al. | |
| 2019/0284694 | A1* | 9/2019 | Knisley | ................... F23R 3/002 |
| 2020/0024194 | A1 | 1/2020 | Wu et al. | |
| 2020/0024735 | A1 | 1/2020 | Wu et al. | |

FOREIGN PATENT DOCUMENTS

| | | |
|---|---|---|
| CN | 107164744 A | 9/2017 |
| JP | 2003526218 A | 9/2003 |
| JP | 2004356612 A | 12/2004 |
| JP | 2005529492 A | 9/2005 |
| JP | 2011006755 A | 1/2011 |
| JP | 2011518256 A | 6/2011 |
| JP | 2019524983 A | 9/2019 |

OTHER PUBLICATIONS

Li M.Y. et al., "Effect of Process Pressure on Atomic Layer Deposition of Al2O3," 2007, vol. 3(15), pp. 107-117.

* cited by examiner

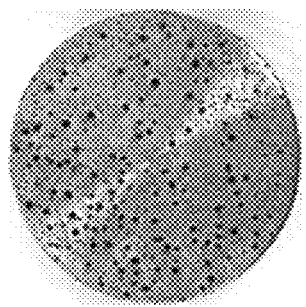
FIG. 4D1
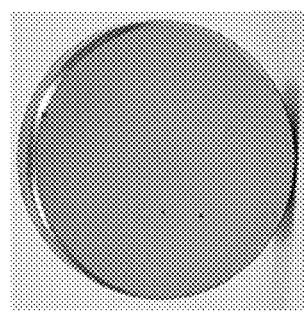
FIG. 4C1
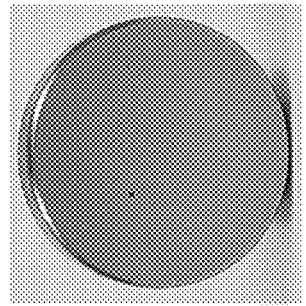
FIG. 4B1
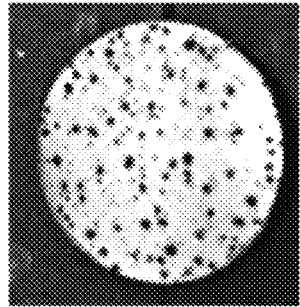
FIG. 4A1
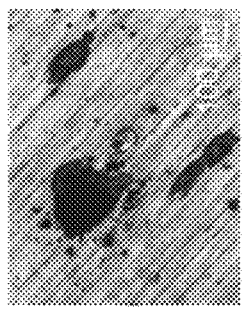
FIG. 4D2
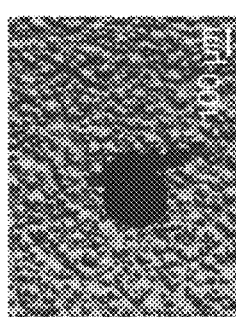
FIG. 4C2
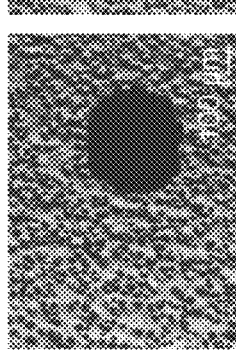
FIG. 4B2
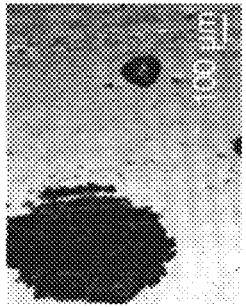
FIG. 4A2
FIG. 4D3
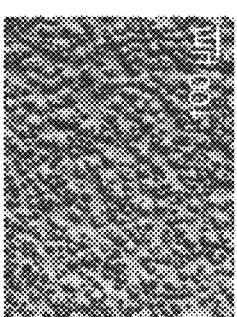
FIG. 4C3
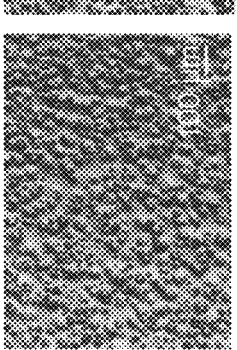
FIG. 4B3
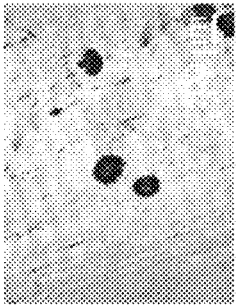
FIG. 4A3

HAFNIUM ALUMINUM OXIDE COATINGS DEPOSITED BY ATOMIC LAYER DEPOSITION

RELATED APPLICATIONS

The present application claims priority to U.S. Provisional Patent Application No. 62/924,938, filed on Oct. 23, 2019, which is herein incorporated by reference in its entirety.

TECHNICAL FIELD

Embodiments of the present disclosure relate to corrosion resistant hafnium aluminum oxide coatings, coated articles, and methods of forming such coatings using atomic layer deposition.

BACKGROUND

In the semiconductor industry, devices are fabricated by a number of manufacturing processes producing structures of an ever-decreasing size. Some manufacturing processes, such as plasma etch and plasma clean processes, expose a substrate to a high-speed stream of plasma to etch or clean the substrate. The plasma may be highly corrosive, and may corrode processing chambers and other surfaces and components that are exposed to the plasma. This corrosion may generate particles, which frequently contaminate the substrate that is being processed, contributing to device defects. Halogen containing plasmas, which can include halogen ions and radicals, can be particularly harsh resulting in particles generated from interaction of the plasma with materials within the processing chamber. The plasmas can also cause wafer process drift due to changes in the surface chemistry of components induced by radical recombination.

As device geometries shrink, susceptibility to defects increases, and particle contaminant specifications (i.e., on-wafer performance) become more stringent. To minimize particle contamination introduced by plasma etch and/or plasma clean processes, chamber materials have been developed that are resistant to plasmas. Examples of such plasma resistant materials include ceramics composed of $Al_2O_3$, AlN, SiC, $Y_2O_3$, quartz, and $ZrO_2$. Different ceramics provide different material properties, such as plasma resistance, rigidity, flexural strength, thermal shock resistance, and so on. Also, different ceramics have different material costs. Accordingly, some ceramics have superior plasma resistance, other ceramics have lower costs, and still other ceramics have superior flexural strength and/or thermal shock resistance.

Plasma spray coatings formed of $Al_2O_3$, AlN, SiC, $Y_2O_3$, quartz, and $ZrO_2$ can reduce particle generation from chamber components, but such plasma spray coatings are unable to penetrate into and coat high aspect ratio features such as gas lines and holes of a showerhead. While some deposition techniques are able to coat high aspect ratio features, the resulting coatings may erode and form particles in certain plasma environments, for example, halogen containing plasmas, or suffer from mechanical segregation of layers of materials due to insufficient inter-diffusion in the coatings.

SUMMARY

According to embodiments herein described is a coated article comprising a body and a corrosion resistant coating on a surface of the body. The corrosion resistant coating may comprise hafnium aluminum oxide comprising about 1 mol % to about 40 mol % of hafnium, about 1 mol % to about 40 mol % of aluminum, and a remainder oxygen, wherein the hafnium aluminum oxide comprises about 20 mol % to about 98 mol % oxygen.

Also described in embodiments herein is a method comprising depositing a corrosion resistant coating on a surface of an article using atomic layer deposition. The corrosion resistant coating may comprise about 1 mol % to about 40 mol % hafnium, about 1 mol % to about 40 mol % aluminum, and the remainder mol % oxygen. The article may comprise a component of a processing chamber selected from the group consisting of a chamber wall, a shower head, a nozzle, a plasma generation unit, a radiofrequency electrode, an electrode housing, a diffuser and a gas line.

Also described herein in embodiments is a method comprising depositing a hafnium aluminum oxide coating on a surface of an article using atomic layer deposition. Depositing the hafnium aluminum oxide coating may comprise contacting the surface with a hafnium-containing precursor or with an aluminum-containing precursor for a first duration to form a first adsorption layer. Depositing the hafnium aluminum oxide coating may further comprise contacting the first adsorption layer with an oxygen-containing reactant to form a first layer comprising a hafnium oxide or an aluminum oxide. Depositing the hafnium aluminum oxide coating may further comprise contacting the first layer with an aluminum-containing precursor or a hafnium-containing precursor for a second duration to form a second adsorption layer. Depositing the hafnium aluminum oxide coating may further comprise contacting the second adsorption layer with the oxygen-containing reactant to form a second layer comprising an aluminum oxide or a hafnium oxide. In an embodiment, when the first layer comprises hafnium oxide, the second layer comprises aluminum oxide, and vice versa. The method may also comprise forming the hafnium aluminum oxide coating from the first layer and the second layer. The corrosion resistant coating may comprise hafnium aluminum oxide comprising about 1 mol % to about 40 mol % of hafnium, about 1 mol % to about 40 mol % of aluminum, and a remainder oxygen, wherein the hafnium aluminum oxide comprises about 20 mol % to about 98 mol % oxygen.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4A1 is a digital camera image of a non-coated stainless steel coupon after being subjected to a 6% $FeCl_3$ immersion test at about 50° C. for about 12 hours.

FIG. 4A2 is an optical microscope image of a first pitted section in a non-coated stainless steel coupon after being subjected to a 6% $FeCl_3$ immersion test at about 50° C. for about 12 hours.

FIG. 4A3 is an optical microscope image of a second pitted section in a non-coated stainless steel coupon after being subjected to a 6% $FeCl_3$ immersion test at about 50° C. for about 12 hours.

FIG. 4B1 is a digital camera image of a stainless steel coupon coated with about 100 μm of $HfAl_2O_5$ coating after being subjected to a 6% $FeCl_3$ immersion test at about 50° C. for about 12 hours.

FIG. 4B2 is an optical microscope image of a pitted section in a stainless steel coupon coated with about 100 μm of $HfAl_2O_5$ coating after being subjected to a 6% $FeCl_3$ immersion test at about 50° C. for about 12 hours.

FIG. 4B3 is an optical microscope image of a non-pitted section in a stainless steel coupon coated with about 100 μm of $HfAl_2O_5$ coating after being subjected to a 6% $FeCl_3$ immersion test at about 50° C. for about 12 hours.

FIG. 4C1 is a digital camera image of a stainless steel coupon coated with about 100 μm of $Hf_2Al_2O_7$ coating after being subjected to a 6% $FeCl_3$ immersion test at about 50° C. for about 12 hours.

FIG. 4C2 is an optical microscope image of a pitted section in a stainless steel coupon coated with about 100 μm of $Hf_2Al_2O_7$ coating after being subjected to a 6% $FeCl_3$ immersion test at about 50° C. for about 12 hours.

FIG. 4C3 is an optical microscope image of a non-pitted section in a stainless steel coupon coated with about 100 μm of $Hf_2Al_2O_7$ coating after being subjected to a 6% $FeCl_3$ immersion test at about 50° C. for about 12 hours.

FIG. 4D1 is a digital camera image of a stainless steel coupon coated with about 100 μm of $Al_2O_3$ coating after being subjected to a 6% $FeCl_3$ immersion test at about 50° C. for about 12 hours.

FIG. 4D2 is an optical microscope image of a first pitted section in a stainless steel coupon coated with about 100 μm of $Al_2O_3$ coating after being subjected to a 6% $FeCl_3$ immersion test at about 50° C. for about 12 hours.

FIG. 4D3 is an optical microscope image of a second pitted section in a stainless steel coupon coated with about 100 μm of $Al_2O_3$ coating after being subjected to a 6% $FeCl_3$ immersion test at about 50° C. for about 12 hours.

DETAILED DESCRIPTION

Figure 1:
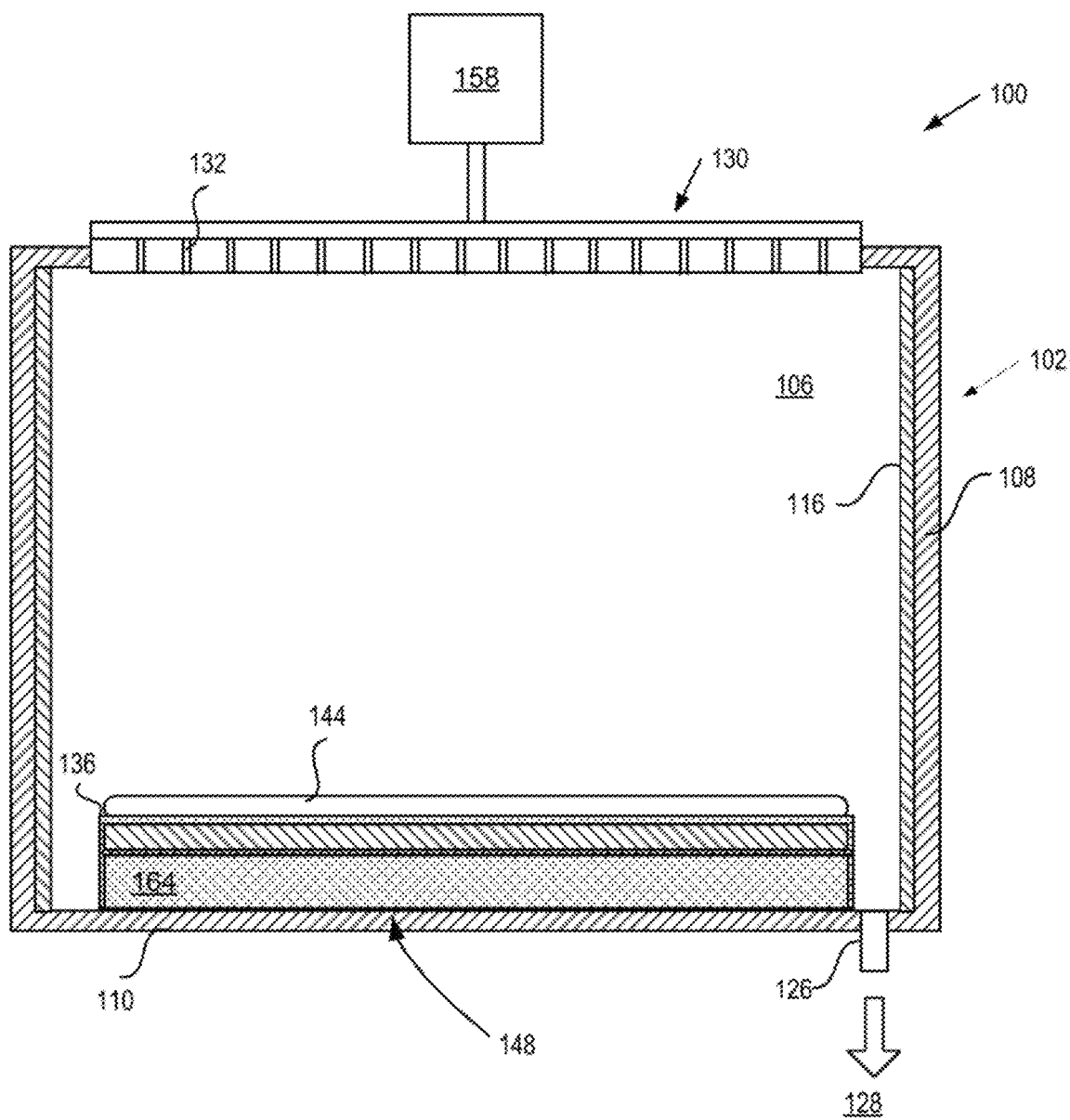
FIG. 1 depicts a sectional view of a processing chamber.

Embodiments described herein relate to hafnium aluminum oxide corrosion resistant coatings for the purpose of improving the corrosion and erosion resistance of chamber components in a plasma environment or in a corrosive non-plasma environment. Embodiments also relate to coated articles (such as chamber components) and methods of forming such corrosion resistant coatings using atomic layer deposition (ALD).

In the semiconductor industry, some manufacturing processes, such as plasma etch and plasma clean processes, expose a substrate to a high-speed stream of plasma to etch or clean the substrate. The plasma may be highly corrosive, and may corrode processing chambers and other surfaces and components that are exposed to the plasma. This corrosion may generate particles, which frequently contaminate the substrate that is being processed, contributing to device defects. Halogen containing plasmas, which can include halogen ions and radicals, can be particularly harsh, resulting in particles generated from interaction of the plasma with materials within the processing chamber. The plasmas can also cause wafer process drift due to changes in the surface chemistry of components induced by radical recombination.

Chamber components (such as stainless steel and aluminum parts) coated with hafnium aluminum oxide coatings deposited by ALD were found to have greater corrosion resistance in Cl-based solutions compared to non-coated and alumina-coated components. Use of $Hf_xAl_yO_z$-coated chamber components for processes with corrosive chemicals may enable greater reduction of on-wafer (i.e., substrate) metal/particle contamination compared to that which may be currently achieved with alumina-coated components. Superior corrosion resistance may be attained with thin hafnium aluminum oxide, which allows for a corrosion resistant coating that may be more cost-effective. Furthermore, hafnium aluminum oxide coatings may withstand relatively high temperatures without cracking or failure, as opposed to traditional coatings.

In certain embodiments, the corrosion resistant coatings may comprise from about 1 mol % to about 40 mol % hafnium, from about 1 mol % to about 40 mol % aluminum, and the remainder oxygen, where the amount of oxygen in the coating may be about 20 mol % to about 98 mol %. In other embodiments, the corrosion resistant coatings may comprise from about 10 mol % to about 20 mol % hafnium, from about 15 mol % to about 30 mol % aluminum, and the remainder oxygen. In certain embodiments, the corrosion resistant coating may comprise a homogenous mixture of hafnium and aluminum having an aluminum to hafnium molar ratio ranging from about 0.8 to about 2.5. In an embodiment, the corrosion resistant coating may comprise at least one of $HfAl_2O_5$ or $Hf_2Al_2O_7$.

Articles that may be coated with the corrosion resistant coating described herein may include a component of a processing chamber selected from a group consisting of a chamber wall, a showerhead, a nozzle, a plasma generation unit, a radiofrequency electrode, an electrode housing, a diffuser and a gas line. In certain embodiments, articles coated with the corrosion resistant coating described herein may comprise a portion having a depth to width aspect ratio ranging from about 10:1 to about 200:1, and the portion of the article having said aspect ratio may be coated with the corrosion resistant coating. For instance, the surface of a gas line may be coated with a corrosion resistant coating according to an embodiment.

The corrosion resistant coating may be conformal, amorphous, have a low porosity (e.g., about 0%), and/or have a uniform thickness (e.g., with thickness variation of less than about +/−5%). In certain embodiments, the corrosion resistant coating may have a thickness ranging from about 0.5 nm to about 1 μm or another thickness encompassed therein.

In certain embodiments, the corrosion resistant coating exhibits its corrosion resistance through a HCl bubble test and/or through a $FeCl_3$ immersion test and/or through a HCl immersion test and/or through dichlorosilane (DSC) exposure test and/or through $Cl_2$ soak test, which are described in further detail below.

For instance, in one embodiment, a corrosion resistant coating having a thickness of about 300 nm may exhibit a longer time to failure as compared to a thicker alumina coating or as compared to a thicker yttrium silicon oxide coating in a HCl bubble test conducted in 5% HCl solution or in 15% HCl solution. For instance, a corrosion resistant coating, at a thickness of about 300 nm, may exhibit at least one of a) at least about 13 hours to failure tested according to an HCl bubble test conducted in 5% HCl solution, or b) at least about 10 hours to failure tested according to a HCl bubble test conducted in 15% HCl solution.

In another embodiment, a hafnium aluminum oxide corrosion resistant coating having a thickness of about 100 nm exhibits less pitting than an aluminum oxide coating having the same thickness in a 6% $FeCl_3$ immersion test conducted at about 50° C. for about 12 hours. In yet another embodiment, a hafnium aluminum oxide coating enhances corrosion resistance of stainless steel as compared to an alumina coating with the same thickness as measured in a HCl immersion test.

In one embodiment, a hafnium aluminum oxide corrosion resistant coating results in no metal contamination of the wafer after about 900 wafer processing cycles (about 45 minutes) at temperature ranging from about 150° C. to about 180° C. in a processing environment that exposes the coating to dichlorosilane.

In one embodiment, a hafnium aluminum oxide corrosion resistant coating results in no corrosion (evident, e.g., by thickness variations) upon soaking the coating in $Cl_2$ for about 25 hours at 380° C. in a vacuum chamber.

In some embodiments, a hafnium aluminum oxide corrosion resistant coating, at a thickness of about 300 nm, takes a force of at least about 52 mN, at least about 75 mN, at least about 80 mN, or at least about 100 mN to expose the surface of the body using a 10 micron diamond stylus in a scratch adhesion test.

As will be discussed in more detail below, the corrosion resistant coating may be co-deposited, co-dosed, or sequentially deposited onto an article using a non-line of sight technique such as atomic layer deposition (ALD).

The coatings described herein may also be resistant to erosion upon exposure to plasma chemistries used for semiconductor processing and chamber cleaning, for example, halogen containing plasmas having halogen ions and halogen radicals. Therefore, the coatings provide good particle performance and process stability performance during such processing and cleaning procedures. As used herein, the terms "erosion resistant coating" or "plasma resistant coating" refer to a coating having a particularly low erosion rate when exposed to particular plasmas, chemistry and radicals (e.g., fluorine-based plasma, chemistry and/or radicals, bromine-based plasma, chemistry and/or radicals, chlorine-based plasma, chemistry and/or radicals, etc.).

Erosion and corrosion resistant coatings described herein may also be resistant to halogen non-plasma corrosive environments, such as, halogens (e.g., chlorine, fluorine, bromine, and so on) and any halogen-containing compound (e.g., chlorine-containing compound, fluorine-containing compound, bromine-containing compound, and so on).

The resistance of the coating to plasma may be measured through "etch rate" (ER), which may have units of Angstrom/min (A/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr, in halogen plasma, is typical for a coating that is corrosion resistant. Variations in the composition of the coating deposited on the chamber component may result in multiple different plasma resistances or erosion rate values. Additionally, a coating that is corrosion resistant with one composition exposed to various plasmas could have multiple different plasma resistances or erosion rate values. For example, a particular coating may have a first plasma resistance or erosion rate associated with a first type of plasma and a second plasma resistance or erosion rate associated with a second type of plasma.

FIG. 1 is a sectional view of a semiconductor processing chamber 100 having one or more chamber components that are coated with a corrosion resistant coating in accordance with embodiments described herein. The base materials of at least some components of the chamber may include one or more of Al (e.g., $Al_xO_y$, AlN, Al 6061, or Al 6063), Si (e.g., $Si_xO_y$, $SiO_2$, or SiC), copper (Cu), magnesium (Mg), titanium (Ti), and stainless steel (SST). The processing chamber 100 may be used for processes in which a corrosive plasma environment (e.g., a halogen plasma such as a chlorine containing plasma, a fluorine containing plasma, a bromine containing plasma, and so on) is provided. For example, the processing chamber 100 may be a chamber for a plasma etcher or plasma etch reactor, a plasma cleaner, plasma enhanced CVD or ALD reactors and so forth. Examples of chamber components that may include the corrosion resistant coating include chamber components with complex shapes and features having high aspect ratios. Some exemplary chamber components include a substrate support assembly, an electrostatic chuck, a ring (e.g., a process kit ring or single ring), a chamber wall, a base, a gas distribution plate, a showerhead, gas lines, a nozzle, a lid, a liner, a liner kit, a shield, a plasma screen, a plasma generation unit, a radiofrequency electrode, an electrode housing, a diffuser, a flow equalizer, a cooling base, a chamber viewport, a chamber lid, and so on.

In certain embodiments, chamber components coated with the corrosion resistant coating described herein may comprise a portion having a high depth to width aspect ratio ranging from about 3:1 to about 300:1 (e.g., about 5:1 to about 250:1, about 10:1 to about 200:1, about 20:1, about 50:1, about 100:1, about 150:1, and so on), and the portion of the article having said aspect ratio may be coated with the corrosion resistant coating. For instance, the internal surface of a gas line or the internal surface of a gas conduit in a showerhead may be coated with a corrosion resistant coating according to an embodiment.

Figure 5:
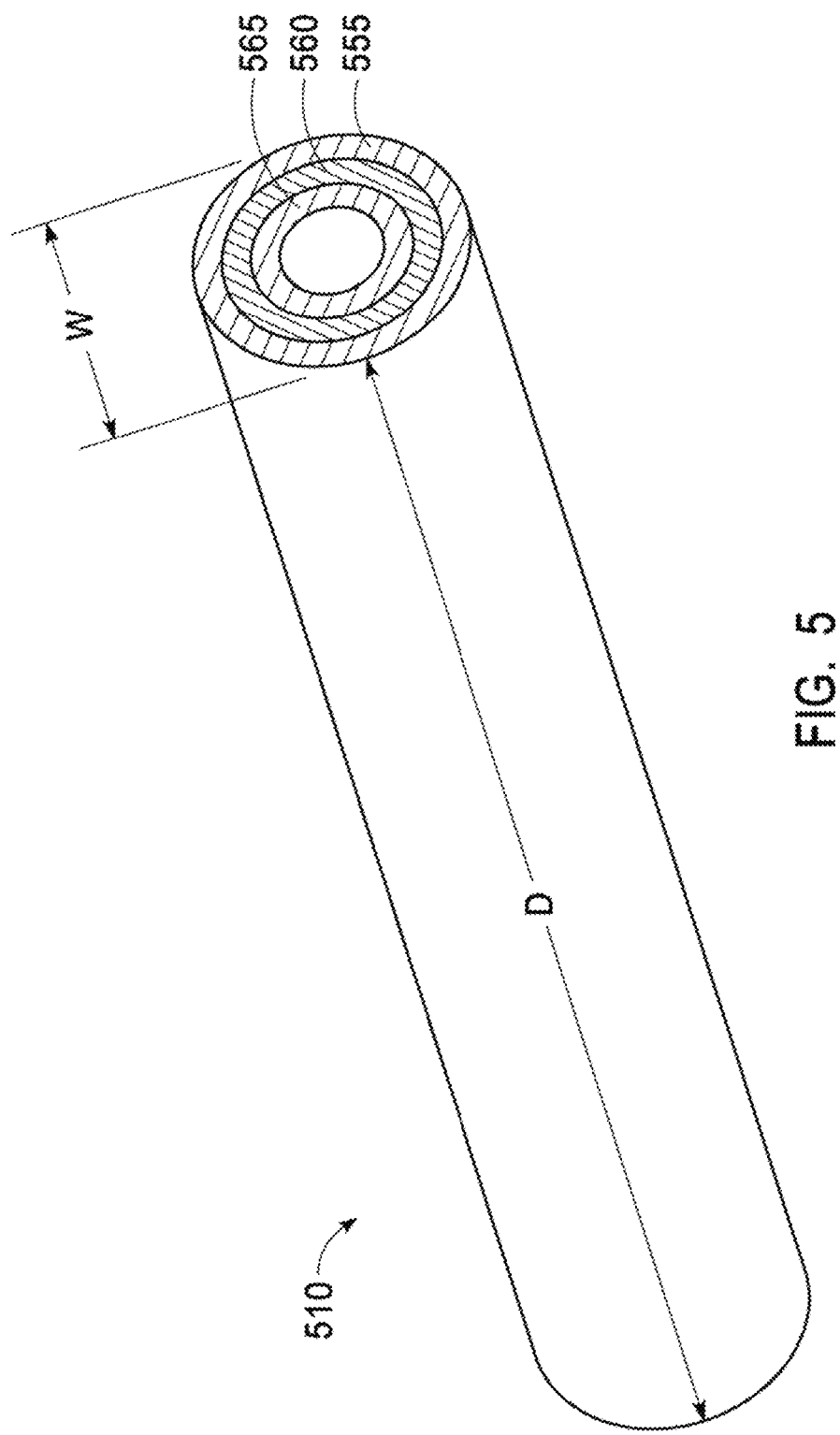
FIG. 5 depicts a blown up view of a gas line having a large aspect ratio coated with a corrosion resistant coating according to an embodiment.

FIG. 5 depicts a blown up view of a gas line having a large aspect ratio coated with a corrosion resistant coating according to an embodiment. Gas line 510 may have a depth D and a width W. Gas line 510 may have a large aspect ratio defined as D:W, wherein the aspect ratio may range from about 3:1 to about 300:1 (e.g., about 5:1 to about 250:1, about 10:1 to about 200:1, bout 50:1 to about 100:1, about 20:1, about 50:1, about 100:1, about 150:1, and so on). In some embodiments, the aspect ratio may be lower than 3:1 or greater than 300:1.

Gas line 510 may have an internal surface 555. Internal surface 555 may be made of aluminum, stainless steel, or any of the other material of construction described herein. Internal surface 555 may be coated with a corrosion resistant coating using ALD as described with respect to FIG. 2A, 2B, or 2C. The ALD process may grow conformal coating layers 560 and 565 of uniform thickness throughout the interior surface of gas line 510 despite its large aspect ratio while ensuring that the final corrosion resistant coating may also be thin enough so as to not plug the gas line.

Returning back to FIG. 1, in one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110. An outer liner 116 may be disposed adjacent the sidewalls 108 to protect the chamber body 102. Any of the showerhead 130 (or lid and/or nozzle), sidewalls 108 and/or bottom 110 may include any of the corrosion resistant coatings described herein.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) having multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier and purge gases include $N_2$, He, Ar, and other gases inert to process gases (e.g., non-reactive gases).

A substrate support assembly 148 is disposed in the interior volume 106 of the processing chamber 100 below the showerhead 130 or lid. The substrate support assembly 148 includes a support 136 that holds the substrate 144 during processing. The support 136 is attached to the end of a shaft (not shown) that is coupled to the chamber body 102 via a flange 164. The substrate support assembly 148 may include, for example, a heater, an electrostatic chuck, a susceptor, a vacuum chuck, or other substrate support assembly component.

Any of the aforementioned components of the processing chamber 100 may include a corrosive resistant coating, as discussed in greater detail below. The corrosive resistant coating may include from about 1 mol % to about 40 mol % hafnium, from about 1 mol % to about 40 mol % aluminum, and the remainder oxygen, where the amount of oxygen in the coating may be about 20 mol % to about 98 mol %.

Figure 2B:
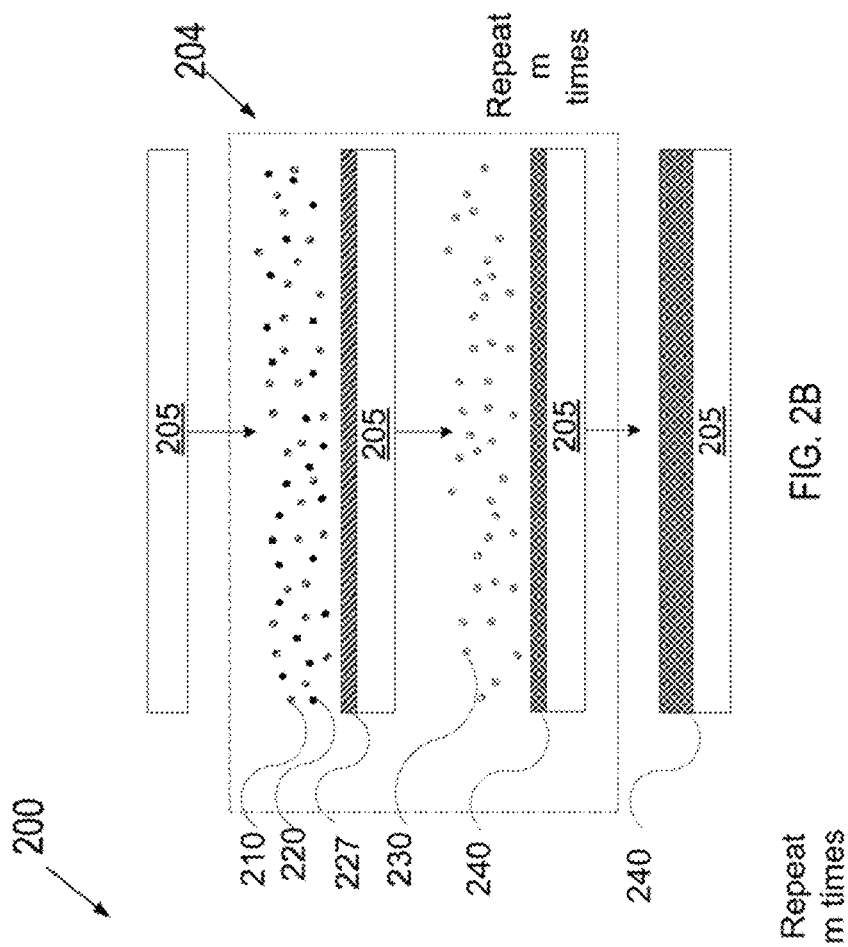
FIG. 2B depicts another embodiment of a co-deposition process in accordance with an atomic layer deposition technique as described herein.
Figure 2A:
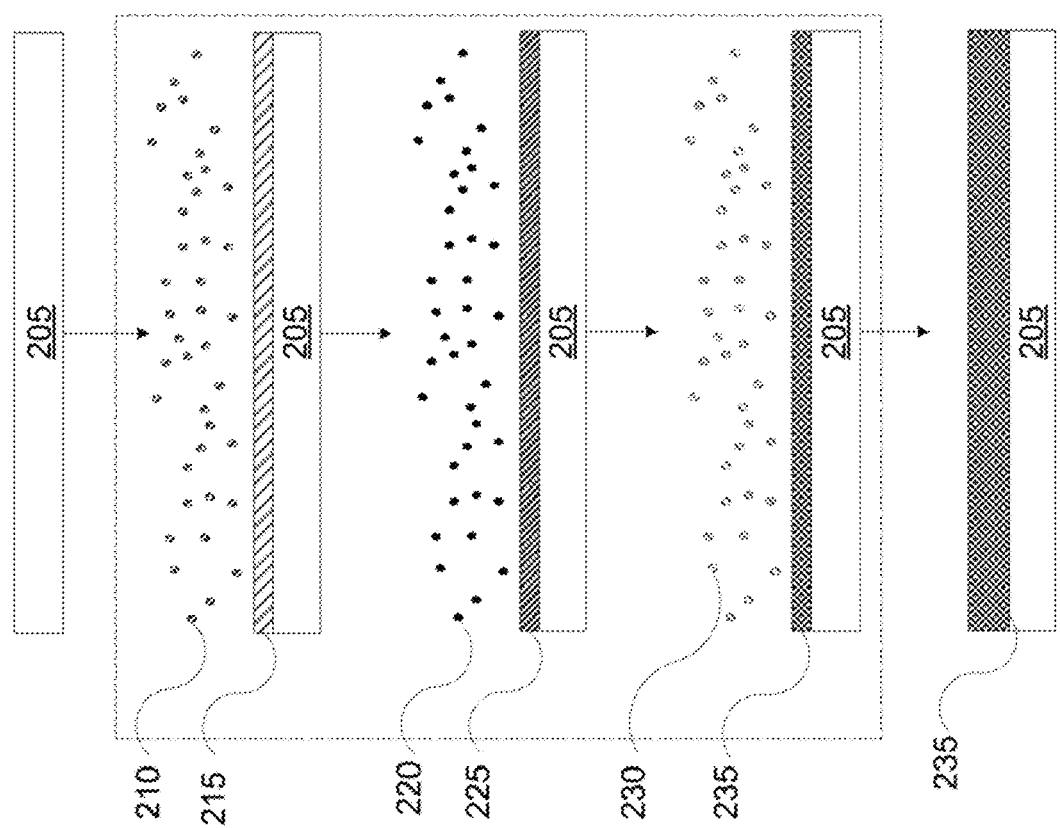
FIG. 2A depicts one embodiment of a co-deposition process in accordance with an atomic layer deposition technique as described herein.
Figure 2C:
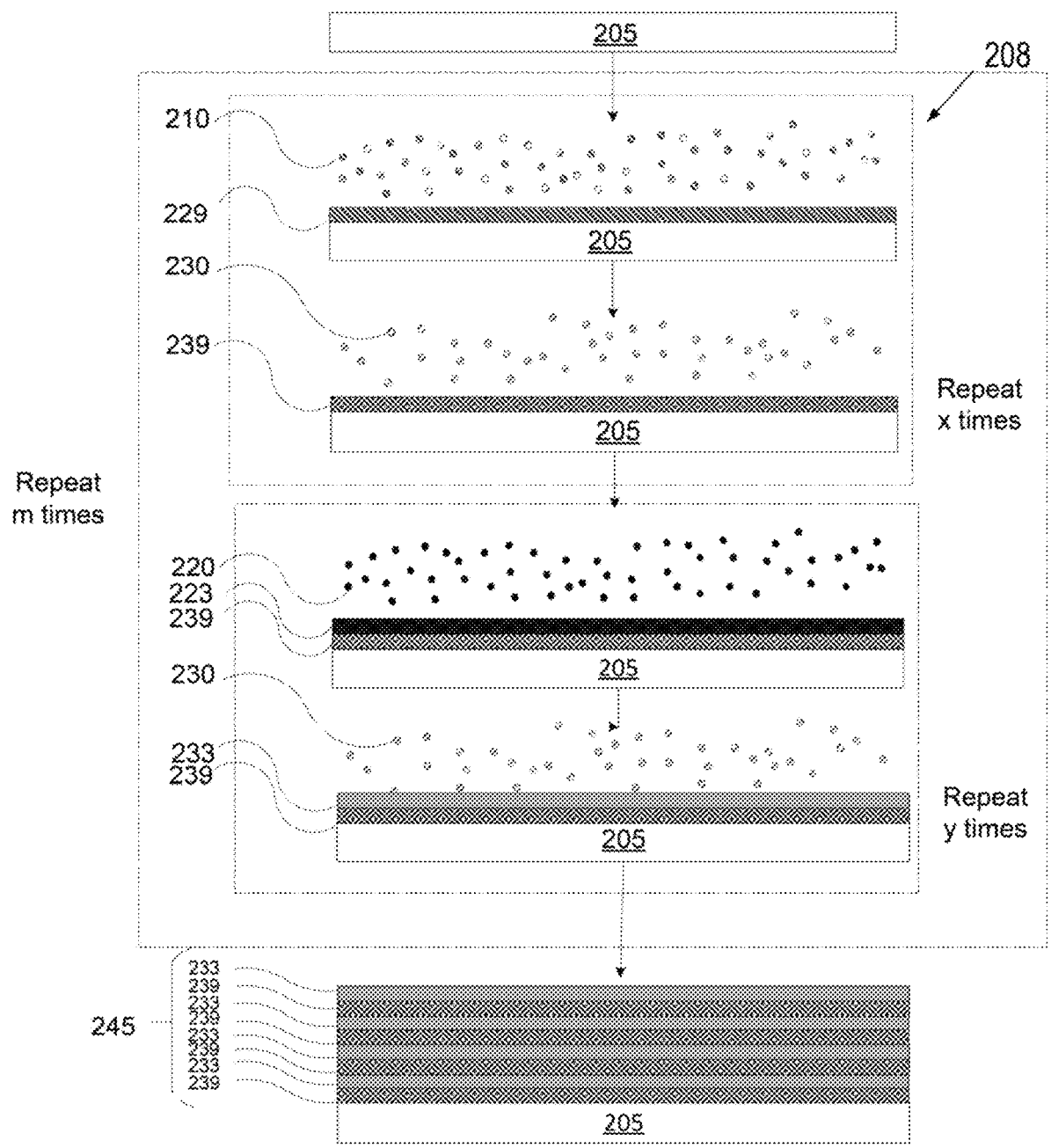
FIG. 2C depicts one embodiment of a sequential deposition process in accordance with an atomic layer deposition technique as described herein.

FIG. 2A depicts an embodiment of a co-deposition process 200 in accordance with an ALD technique to grow or deposit a hafnium aluminum oxide coating on an article (e.g., on any of the chamber components discussed with reference to FIG. 1). FIG. 2B depicts another embodiment of a co-deposition process 204 in accordance with an ALD technique as described herein to grow or deposit a hafnium aluminum oxide coating on an article. FIG. 2C depicts another embodiment of a sequential deposition process 208 in accordance with an ALD technique to grow or deposit a hafnium aluminum oxide coating as described herein.

For ALD co-deposition processes 200 and 204, either adsorption of at least two precursors onto a surface or a reaction of a reactant with the adsorbed precursors may be referred to as a "half-reaction."

During a first half reaction in process 200, a first precursor 210 (or first mixture of precursors) may be pulsed onto a surface of the article 205 for a period of time sufficient to allow the precursor to partially (or fully) contact and adsorb onto the surface of the article (including surfaces of holes and features within the article). In certain embodiments, the first precursor may be pulsed into the ALD chamber for a first duration of about 50 milliseconds to about 60 seconds, or about 1 second to about 60 seconds, or about 5 seconds to about 60 seconds, or about 10 seconds to about 60 seconds. The first precursor 210 (or first mixture of precursors) may be a hafnium-containing precursor and/or an aluminum-containing precursor.

The adsorption is self-limiting as the precursor will adsorb onto a number of available sites on the surface, forming a partial adsorption layer of a first metal 215 (e.g., hafnium and/or aluminum) on the surface. Any sites that have already adsorbed with the first metal of the precursor will become unavailable for further adsorption with a subsequent precursor. Alternatively, some sites that have become adsorbed with the first metal of the first precursor may be displaced with a second metal of a second precursor that is adsorbed at the site.

To complete the first half reaction, a second precursor 220 (or optionally a second mixture of precursors) may be pulsed onto a surface of the article 205 for a second duration sufficient to allow a second metal of the second precursor to (partially or fully) adsorb onto available sites on the surface (and possibly to displace some of the first metal of the first precursor), forming a co-deposition adsorption layer (e.g., layer 225 in FIG. 2A) on the surface. In certain embodiments, the second precursor may be pulsed into the ALD chamber for a second duration of about 50 milliseconds to about 60 seconds, or about 1 second to about 60 seconds, or about 5 seconds to about 60 seconds, or about 10 seconds to about 60 seconds. The second precursor (or second mixture of precursors) may be a hafnium-containing precursor and/or an aluminum-containing precursor. For instance, when the first precursor comprises a hafnium-containing precursor, the second precursor may comprise an aluminum-containing precursor, and vice versa.

The excess precursor may then be flushed out of or purged out of the ALD chamber (i.e., with an inert gas) before a reactant 230 is introduced into the ALD chamber. In certain embodiments, the reactant may be introduced into the ALD chamber for a duration of about 50 milliseconds to about 60 seconds, or about 1 second to about 60 seconds, or about 5 seconds to about 60 seconds, or about 10 seconds to about 60 seconds. For an oxide coating, the reactant may be an oxygen-containing reactant. After the oxygen-containing reactant 230 has reacted with the co-adsorption layer (225 in FIG. 2A) to form coating layer 235 (e.g., $Hf_xAl_yO_z$), any excess oxygen-containing reactant may be flushed out of the ALD chamber. Alternatively, or additionally, the ALD chamber may be purged during the first half reaction between deposition of the first precursor and the second precursor.

Referring to FIG. 2B, an article 205 may be inserted into an ALD chamber. In this embodiment, the co-deposition process involves co-dosing at least two precursors simultaneously onto the surface of the article. Article 205 may be introduced to a mixture of precursors 210, 220 (e.g., hafnium-containing precursor(s) and aluminum-containing precursor(s)) for a duration until a surface of the article or a body of the article is fully contacted and adsorbed with the mixture of precursors 210, 220 to form co-adsorption layer 227. In certain embodiments, the mixture of first and second precursors may be pulsed into the ALD chamber for a first duration of about 50 milliseconds to about 60 seconds, or about 1 second to about 60 seconds, or about 5 seconds to about 60 seconds, or about 10 seconds to about 60 seconds. The mixture of precursors 210, 220 (may also be referred to herein as precursors A and B) may be co-injected ($A_xB_y$) at any number of ratios, for example, A90+B10, A70+B30, A50+B50, A30+B70, A10+A90 and so on, into the chamber and adsorbed on the surface of the article. In these examples, x and y are expressed in atomic ratios (mol %) for Ax+By. For example A90+B10 is 90 mol % of A and 10 mol % of B.

In some embodiments, a mixture of two precursors is introduced (i.e., co-dosed) together, where the mixture includes a first weight percentage of a first metal containing precursor and a second weight percentage of a second metal containing precursor. For example, the mixture of precursors may include about 1 wt % to about 90 wt %, or about 5 wt % to about 80 wt % or about 20 wt % to about 60 wt % of a first metal containing precursor and about 1 wt % to about 90 wt %, or about 5 wt % to about 80 wt % or about 20 wt % to about 60 wt % of a second metal containing precursor. The mixture may include a ratio of the first metal (e.g., hafnium) containing precursor to the second metal containing precursor (e.g., aluminum) that is suitable to form a target type of hafnium aluminum oxide material. The atomic ratio of the first metal (e.g., hafnium) containing precursor to the second metal containing precursor (e.g., aluminum) may be about 10:1 to about 1:10, or about 8:1 to about 1:8, or about 5:1 to about 1:5, or about 4:1 to about 1:4, or about 3:1 to about 1:3, or about 2:1 to about 1:2, or about 1:1.

Subsequently, article 205 having co-adsorption layer 227 may be introduced to an oxygen reactant 230 to react with co-adsorption layer 227 to grow a hafnium aluminum oxide corrosion resistant coating 240. In certain embodiments, the reactant may be introduced into the ALD chamber for a second duration of about 50 milliseconds to about 60 seconds, or about 1 second to about 60 seconds, or about 5 seconds to about 60 seconds, or about 10 seconds to about 60 seconds.

As shown in FIGS. 2A and 2B, the co-deposition cycles for depositing corrosion resistant coating 235 and 240 may be repeated m times to achieve a certain coating thickness, where m is an integer or a fraction value greater than 1. For ALD, the final thickness of material is dependent on the number of reaction cycles, m, that are run because each reaction cycle will grow a layer of a certain thickness that may be one atomic layer or a fraction of an atomic layer.

With reference to FIG. 2C, in some embodiments, a multi-layer stack may be deposited on article 205 using a sequential deposition ALD process 208. In a sequential ALD a first metal-containing precursor 210 (e.g., hafnium-containing precursor(s) or aluminum-containing precursor(s)) may be introduced into the ALD chamber to adsorb onto the surface of article 205 and form a first adsorption layer 229. In certain embodiments, the first precursor may be pulsed into the ALD chamber for a duration of about 50 milliseconds to about 60 seconds, or about 1 second to about 60 seconds, or about 5 seconds to about 60 seconds, or about 10 seconds to about 60 seconds. Thereafter, an inert gas may be pulsed into the ALD chamber to flush out any unreacted first metal-containing precursor 210.

Then a reactant 230 (such as an oxygen-containing reactant) may be introduced into the ALD chamber to react with the first adsorption layer 229 and form a first metal oxide layer 239 (e.g., a hafnium oxide layer or an aluminum oxide layer). In certain embodiments, the reactant may be pulsed into the ALD chamber for a duration of about 50 milliseconds to about 60 seconds, or about 1 second to about 60 seconds, or about 5 seconds to about 60 seconds, or about 10 seconds to about 60 seconds. Any excess reactant may be flushed out by introducing an inert gas into the ALD chamber. This first part of the sequential ALD process may be repeated x times until a first target thickness for the first metal oxide layer 239 is achieved, where x may be an integer or a fraction. In some embodiments, x is greater than 1.

The first target thickness may range from about 5 angstroms to about 100 angstroms, about 10 angstroms to about 80 angstroms, or about 20 angstroms to about 50 angstroms. In some embodiments, the first target thickness may range from about 1 nm to about 1000 nm, from about 20 nm to about 500 nm, from about 20 nm to about 400 nm, from about 20 nm to about 300 nm, from about 20 nm to about 200 nm, from about 20 nm to about 100 nm, from about 50 nm to about 100 nm, or from about 20 nm to about 50 nm.

After x cycles of the first part of the sequential ALD process, a second metal-containing precursor 220 (e.g., hafnium-containing precursor(s) or aluminum-containing precursor(s), whichever one was not introduced in the first half reaction) may be introduced into the ALD chamber to adsorb onto the first metal oxide layer 239 and form a second adsorption layer 223. In certain embodiments, the second precursor may be pulsed into the ALD chamber for a duration of about 50 milliseconds to about 60 seconds, or about 1 second to about 60 seconds, or about 5 seconds to about 60 seconds, or about 10 seconds to about 60 seconds. Thereafter, an inert gas may be pulsed into the ALD chamber to flush out any unreacted second metal-containing precursor 220.

Then a reactant (such as an oxygen-containing reactant) may be introduced into the ALD chamber to react with the second adsorption layer 223 and form a second metal oxide layer 233. In certain embodiments, the reactant may be pulsed into the ALD chamber for a duration of about 50 milliseconds to about 60 seconds, or about 1 second to about 60 seconds, or about 5 seconds to about 60 seconds, or about 10 seconds to about 60 seconds. The reactant in this second part of the sequential ALD process may be the same as reactant 230 from the first part of the sequential ALD process or different. Any excess reactant may be flushed out by introducing an inert gas into the ALD chamber. This second part of the sequential ALD process may be repeated y times until a second target thickness for the second metal oxide 233 is achieved, where y may be an integer or a fraction. In certain embodiments, y is greater than 1.

The second target thickness may range from about 5 angstroms to about 100 angstroms, about 10 angstroms to about 80 angstroms, or about 20 angstroms to about 50 angstroms. In some embodiments, the second target thickness may range from about 1 nm to about 1000 nm, from about 20 nm to about 500 nm, from about 20 nm to about 400 nm, from about 20 nm to about 300 nm, from about 20 nm to about 200 nm, from about 20 nm to about 100 nm, from about 50 nm to about 100 nm, or from about 20 nm to about 50 nm.

In some embodiments, the ratio of a thickness of each hafnium oxide layer to a thickness of each aluminum oxide layer in a stack of alternating hafnium oxide and aluminum oxide layers ranges from about 10:1 to about 1:10. For example, the ratio of thickness may be from about 8:1 to about 1:8, from about 5:1 to about 1:5, from about 10:1 to about 1:1, from about 1:1 to about 1:10, from about 5:1 to about 1:1, or from about 1:1 to about 1:5. The thickness ratio may be selected in accordance with specific chamber applications.

The first part and the second part of the sequential ALD process together form a super-cycle. This super-cycle may be repeated m times until a target thickness for the corrosion resistant coating 245 is achieved and until a target number of alternating layers of the first metal oxide and the second metal oxide is achieved. The number of super-cycles, m, may be an integer or a fraction. In certain embodiments, m is greater than 1.

The relative concentrations of the first metal (e.g., hafnium) and the second metal (e.g., aluminum) in the coating may be controlled by the type of precursors used, by the temperature of the ALD chamber during adsorption of the precursors onto the surface of the article, the amount of time that the particular precursors remain in the ALD chamber, the partial pressures of the precursors, and so on. In certain embodiments, the coating may contain about 1 mol % to about 40 mol %, about 5 mol % to about 30 mol %, or about 10 mol % to about 20 mol % of hafnium and about 1 mol % to about 40 mol %, about 5 mol % to about 35 mol %, or about 15 mol % to about 30 mol % aluminum. The remainder of the coating may be oxygen such that the total mol % of hafnium, aluminum and oxygen may add up to about 100 mol % in certain embodiments. For instance, the coating may contain from about 2 mol % to about 98 mol % oxygen, from about 35 mol % to about 90 mol % oxygen, or from about 50 mol % to about 75 mol % oxygen.

In certain embodiments, the corrosion resistant coating may comprise $Hf_xAl_yO_z$ where the variables x,y,z may be positive integers or decimal values. In certain embodiments, an aluminum to hafnium molar ratio (y:x) may range from about 0.5 to about 4, from about 0.6 to about 3, from about 0.7 to about 2.8, or from about 0.8 to about 2.5. In one embodiment, the aluminum to hafnium molar ratio may be about 2.2. In another embodiment, the aluminum to hafnium molar ratio may be about 1.0. In an embodiment, the corrosion resistant coating may comprise $HfAl_2O_5$, $Hf_2Al_2O_7$, or a mixture thereof.

Prior to depositing corrosion resistant coating 235, 240, or 245 according to any of the ALD processes described herein, an optional buffer layer may be deposited onto article 205. The buffer layer may also be deposited by an ALD process as exemplified in ALD processes 200, 204, or 208. The buffer layer may include but is not limited to, an aluminum oxide (e.g., $Al_2O_3$), a silicon oxide (e.g., $SiO_2$), aluminum nitride, combinations thereof, or another suitable material. In an example where the buffer layer is alumina ($Al_2O_3$), the precursor may be an aluminum containing precursor (e.g., trimethyl aluminum (TMA)) and the reactant may be an oxygen-containing reactant (e.g., $H_2O$). It should be understood that the corrosion resistant coatings described herein may also be deposited on the buffer layer rather than on a surface of the article. Any of the ALD processes described herein may be used to deposit a corrosion resistant coating on a buffer layer. In embodiments, the buffer layer may have a thickness of about 10 nm to about 1.5 μm, or about 10 nm to about 15 nm, or about 0.8 μm to about 1.2 μm.

The buffer layer may provide robust mechanical properties and may enhance dielectric strength, provide better adhesion of the corrosion resistant coating to the component and prevent cracking of the corrosion resistant coating at temperatures up to about 350° C., or up to about 300° C., or up to about 250° C., or up to about 200° C., or from about 200° C. to about 350° C., or from about 250° C. to about 300° C. For instance, the material of construction of a chamber component to be coated may have a coefficient of thermal expansion that may be significantly higher than the coefficient of thermal expansion of a corrosion resistance coating. By first applying the buffer layer, the detrimental effect of mismatch in coefficients of thermal expansion between the chamber component and the corrosion resistant coating may be managed. In some embodiments, the buffer layer may include a material that has a thermal expansion coefficient between the value of the chamber component's thermal expansion coefficient and the value of the corrosion resistant coating's thermal expansion coefficient. Additionally, the buffer layer may act as a barrier that prevents migration of metal contaminants (e.g., Mg, Cu, etc. trace metals) from the component into the corrosion resistant coating. The addition of a buffer layer under the corrosion resistant coating may increase the thermal resistance of the corrosion resistant coating as a whole by relieving the elevated stress that may be concentrated at some areas of the corrosion resistant coating/chamber component interface.

In one embodiment, the buffer layer may be $Al_2O_3$, such as amorphous $Al_2O_3$. The addition of an amorphous $Al_2O_3$ layer as a buffer layer under a corrosion resistant coating may increase the thermal resistance of the corrosion resistant coating as a whole by relieving the elevated stress that may be concentrated at some areas of the corrosion resistant coating/chamber component interface. Moreover, $Al_2O_3$ has good adhesion to an aluminum based component because of common elements (i.e., the aluminum). Similarly, $Al_2O_3$ has good adhesion to corrosion resistant coatings containing a metal oxide also because of common elements (i.e., the oxides). These improved interfaces reduce interfacial defects which are prone to initiate cracks. Additionally, the amorphous $Al_2O_3$ layer may act as a barrier that prevents migration of metal contaminants (e.g., Mg, Cu, etc. trace metals) from the component into the corrosion resistant coating.

In some embodiments, the thickness of the corrosion resistant coating described herein may range from about 0.5 nm to about 1000 nm. In embodiments, the coating may have a maximum thickness of about 750 nm, a maximum thickness of about 500 nm, a maximum thickness of about 400 nm, a maximum thickness of about 300 nm, a maximum thickness of about 250 nm, a maximum thickness of about 200 nm, a maximum thickness of about 150 nm, a maximum thickness of about 100 nm, a maximum thickness of about 50 nm, a maximum thickness of about 30 nm, a maximum thickness of about 20 nm, or another maximum thickness. In embodiments, the coating may have a minimum thickness of about 1 nm, a minimum thickness of about 5 nm, a minimum thickness of about 10 nm, a minimum thickness of about 20 nm, a minimum thickness of about 25 nm, a minimum thickness of about 35 nm, a minimum thickness of about 50 nm, a minimum thickness of about 100 nm, a minimum thickness of about 150 nm, or another minimum thickness.

A ratio of the corrosion resistant coating layer thickness to the buffer layer thickness, if one is present, may be about 200:1 to about 1:200, or about 100:1 to about 1:100, or about 50:1 to about 1:50. A higher ratio of the corrosion resistant layer thickness to the buffer layer thickness (e.g., 200:1, 100:1, 50:1, 20:1, 10:1, 5:1, 2:1 etc.) may provide better corrosion and erosion resistance, while a lower ratio of the corrosion resistant layer thickness to the buffer layer thickness (e.g., 1:2, 1:5, 1:10, 1:20, 1:50, 1:100, 1:200) may provide better heat resistance (e.g., improved resistance to cracking and/or delamination caused by thermal cycling). The thickness ratio may be selected in accordance with specific chamber applications.

Aside from being a conformal process, ALD is also a uniform process and is capable of forming very thin films. All exposed surfaces of the article will have the same or approximately the same amount of material deposited. The ALD technique can deposit a thin layer of material at a relatively low temperature (e.g., about 20° C. to about 650° C., about 25° C. to about 350° C., about 20° C. to about 200° C., about 20° C. to about 150° C., about 20° C. to about 100° C., and so on) so that it does not damage or deform any materials of the component.

Additionally, the ALD technique can also deposit a conformal, uniform, continuous, low porosity, and high density layer of material within complex geometric shapes and features (e.g., high aspect ratio features such as holes and apertures) and three-dimensional structures on the article. Furthermore, the ALD technique generally produces coatings that are porosity-free (i.e., pin-hole free), which may eliminate crack formation during deposition. As such, all layers deposited by ALD may be uniform, continuous, conformal, have a high density, and be porosity free (e.g., have a porosity of 0%).

In some embodiments, the corrosion resistant coating described herein has a conformal and complete coverage of the underlying surface that is coated (including coated surface features) with a uniform thickness having a thickness variation of less than about +/−20%, a thickness variation of less than about +/−10%, a thickness variation of less than about +/−5%, or a lower thickness variation, as measured by comparing the thickness of the corrosion resistant coating at one location with the thickness of the corrosion resistant coating at another location (or as measured by obtaining the thickness of the corrosion resistant coating at a plurality of locations and calculating the standard deviation of the obtained thickness values).

In some embodiments, the corrosion resistance coating may have a roughness that matches the roughness of the underlying surface that is coated. In certain embodiments, the corrosion resistant coating may have a surface roughness that is within about +/−20% or less, within about +/−10% or less, or within about +/−5% or less, as compared to the surface roughness of the underlying surface that is being coated. In certain embodiments, the surface that is being coated may have a surface roughness of about 120 μin to about 180 μin, or about 130 μin to about 170 μin, or about 140 μin to about 160 μin.

In some embodiments, the corrosion resistant coating may be very dense and have a very low porosity as compared to other deposition techniques (such as e-beam IAD or plasma spray). For instance, the corrosion resistant coating may have a porosity of less than about 1.5%, less than about 1%, less than about 0.5%, or about 0% (i.e., porosity free). The term "porosity-free" as used herein means absence of any pores, pin-holes, voids, or cracks along the whole depth of the coating as measured by transmission electron microscopy (TEM). In contrast, with conventional e-beam IAD or plasma spray techniques or doping or slurry-based coating, where the porosity may be 1-5% and in some instances even higher.

In some embodiments, corrosion resistant coatings described herein may have composition purity of about 90% to about 100%, about 95% to about 100%, about 97% to about 100%, about 99% to about 100%, greater than about 99.95%, or about 99.98%, measured by laser ablation ICP-MS.

In certain embodiments, after performing any of the ALD processes described herein to deposit a corrosion resistant coating, the coating may be subjected to annealing. Annealing may be performed at a temperature ranging from about 200° C. to about 2000° C., from about 400° C. to about 1800° C., from about 600° C. to about 1500° C., from about 800° C. to about 1200°, and any range therein. In certain embodiments, an annealing temperature of up to about 500° C. may be used for corrosion resistant coatings described herein. Annealing may contribute to interdiffusion between various metal oxides (e.g., interdiffusion between the a hafnium oxide portion and an aluminum oxide portion) to form a homogenous interdiffused mixed (or complex) metal oxide corrosion resistant layer (e.g., homogenous interdiffused hafnium aluminum oxide layer).

In some embodiments, two or more of the above described ALD deposition techniques may be combined to produce a homogenous metal oxide corrosion resistant coating. For example, co-deposition and co-dosing may be combined, co-deposition and sequential deposition may be combined, and/or co-dosing and sequential deposition may be combined.

The ALD processes described herein may be preceded by optionally cleaning the article to be coated, placing/loading the article to be coated into an ALD deposition chamber, and selecting ALD conditions (e.g., precursors type and concentration, reactants type and concentration, ALD temperature, pressure, and so on) for forming the corrosion resistant coating. Cleaning the article and/or selecting the ALD conditions and/or depositing the coating may all be performed by the same entity or by multiple entities.

In certain embodiments, the article may be cleaned with an acid solution. In one embodiment, the article is bathed in a bath of the acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and additional metals.

In embodiments, hafnium containing precursors that may be used in an ALD process to deposit a hafnium aluminum oxide corrosion resistant coating may include, without limitations, bis(cyclopentiadienyl)dimethylhafnium, bis(methylcyclopentadienyl)dimethylhafnium, bis(methylcyclopentadienyl)methoxymethylhafnium, hafnium(IV) t-butoxide, hafnium (IV) ethoxide, tetrakis(diethylamino)hafnium (TDMAHf), tetrakis(ethylmethylamino)hafnium (TEMAHf), tetrakis(2,2,6,6-tetramethyl-3,5-heptanedionato)hafhium (IV), $HfCl_4$, HfCp, or any combination thereof.

In embodiments, aluminum containing precursors that may be used in an ALD process to deposit a hafnium aluminum oxide corrosion resistant coating (or an aluminum oxide buffer layer) may include, without limitations, trimethylaluminum (TMA), diethylaluminum ethoxide, tris(ethylmethylamido)aluminum, aluminum sec-butoxide, aluminum tribromide, aluminum trichloride, triethylaluminum (TEA), triisobutylaluminum, trimethylaluminum, tris(diethylamido)aluminum, or any combination thereof.

In embodiments, an oxygen containing reactant that may be used in an ALD process to deposit a hafnium aluminum oxide corrosion resistant coating (or an aluminum oxide buffer layer) may include, without limitations, oxygen gas ($O_2$), water vapor ($H_2O$), ozone ($O_3$), oxygen radicals (O*), alcohol reactants, or other oxygen-containing material.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing methods described herein.

Example 1—Properties of ALD Deposited Hafnium Aluminum Oxide Coatings

Using Rutherford Backscattering/X-Ray Fluorescence (RBS/XRF) film stoichiometry, it was determined that the atomic concentration of the Hf, Al and O in two hafnium aluminum oxide coatings deposited by ALD was constant throughout the depth of the film (i.e., homogenous throughout the depth of the film). Table 1 provides the atomic concentrations of hafnium, aluminum, and oxygen for the two hafnium aluminum oxide coatings.

TABLE 1

| | RBS/XRF Data | | | |
|---|---|---|---|---|
| Target Composition | Hf (at. %) | Al (at. %) | O (at. %) | Al/Hf Ratio |
| $HfAl_2O_5$ | 11.6 | 25.4 | 63 | 2.2 |
| $Hf_2Al_2O_7$ | 16.9 | 17.3 | 65.8 | 1.0 |

Figure 3B:
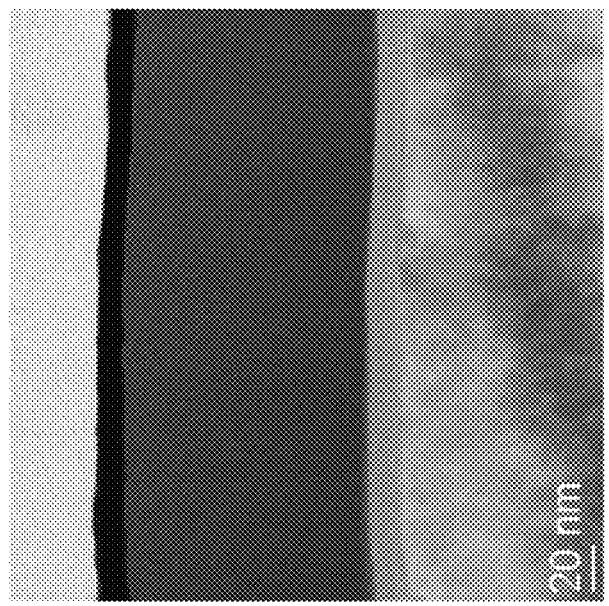
FIG. 3B is a transmission electron microscopy image of a sequentially deposited $HfAl_2O_5$ coating.
Figure 3A:
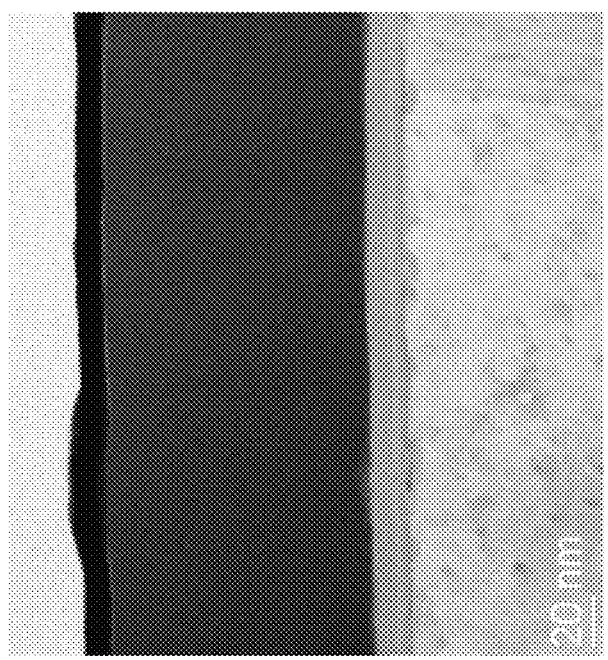
FIG. 3A is a transmission electron microscopy image of a sequentially deposited $Hf_2Al_2O_7$ coating.

FIGS. 3A and 3B depict the microstructure of the hafnium aluminum oxide coatings from Table 1. FIG. 3A is a TEM image, at 20 nm scale, of a $Hf_2Al_2O_7$ coating deposited by ALD. FIG. 3B is a TEM image, at 20 nm scale, of a $HfAl_2O_5$ coating deposited by ALD. TEM images in FIGS. 3A and 3B illustrate that the hafnium aluminum oxide coatings are amorphous, dense, free of porosity, uniform, continuous, and conformal.

Example 2—$FeCl_3$ Pitting (Immersion) Test

The corrosion resistance of two hafnium aluminum oxide coatings deposited by ALD was compared to the corrosion resistance of an aluminum oxide coating deposited by ALD, based on a pitting test. The following four samples were compared: 2a) a non-coated stainless steel electropolished 316L coupon, 2b) a stainless steel electropolished 316L coupon coated with about 100 nm of $HfAl_2O_5$ coating deposited by ALD, 2c) a stainless steel electropolished 316L coupon coated with about 100 nm of $Hf_2Al_2O_7$ coating deposited by ALD, and 2d) a stainless steel electropolished 316L coupon coated with about 100 nm of $Al_2O_3$ coating deposited by ALD.

These four samples were immersed in a 6% $FeCl_3$ solution at about 50° C. for about 12 hours. Thereafter, the samples were removed from the solution and the quality of the surface was examined for evidence of pitting. FIGS. 4A1, 4B1, 4C1, and 4D1 depict digital camera images of the surfaces of samples 2a), 2b), 2c), and 2d), respectively, after said pitting test. FIGS. 4A2, 4B2, 4C2, and 4D2 depict optical microscope images of areas on surfaces of samples 2a), 2b), 2c), and 2d), respectively, that exhibited more pitting. FIGS. 4A3, 4B3, 4C3, and 4D3 depict optical microscope images of areas on surfaces of samples 2a), 2b), 2c), and 2d), respectively, that exhibited less pitting.

As evidenced in FIGS. 4A1 through 4D3, hafnium aluminum oxide coatings (i.e., samples 2b) and 2c) in FIGS. 4B1, 4B2, 4B3, 4C1, 4C2, and 4C3) performed better in the pitting (immersion) test which may be correlated with a better corrosion resistance as compared to an aluminum oxide coating deposited by ALD (in FIGS. 4D1, 4D2, and 4D3) or as compared to a non-coated stainless steel surface (in FIGS. 4A1, 4A2, and 4A3).

Example 3—HCl Bubble Test

The corrosion resistance of a hafnium aluminum oxide coating deposited by ALD was compared to the corrosion resistance of an aluminum oxide coating deposited by ALD and to the corrosion resistance of a yttrium silicon oxide coating deposited by ALD based on a HCl bubble test. The three samples that were tested are: 3a) an Al 6061 coupon coated with about 500 nm of $Al_2O_3$ coating deposited by ALD, 3b) an Al 6061 coupon coated with about 300 nm of $Hf_2Al_2O_7$ coating deposited by ALD, and 3c) an Al 6061 coupon coated with about 500 nm of $Y_2Si_2O_7$ coating deposited by ALD.

The HCl bubble test was conducted by exposing a portion of each coating sample (samples 3a), 3b), and 3c)) to two HCl acid solutions (a 5% HCl solution and a 15% HCl solution) for a period of time until a reaction between the HCl and the underlying substrate (Al 6061) became visible. This test may be indicative of the coating's protection of the underlying substrate under corrosive conditions (e.g., corrosive processing conditions). The appearance of bubbles being indicative of the HCl having penetrated the coating and started reacting with the Al 6061 substrate underneath the coating. A longer time to see bubbles (i.e., for the HCl to penetrate the coating) may be correlated with better corrosion resistance and/or chamber performance.

The time to failure (i.e., time for the HCl to penetrate the coating and start reacting with the underlying substrate as evidenced by the appearance of bubbles) of samples 3a), 3b), and 3c) is summarized in Table 2 below:

TABLE 2

Time to Failure for Coatings on Al 6061 Substrates

| Solution | Sample 3a - 500 nm $Al_2O_3$ | Sample 3b - 300 nm $Hf_2Al_2O_7$ | Sample 3c - 500 nm $Y_2Si_2O_7$ |
|---|---|---|---|
| 5% HCl | 11 hours | 13 hours | 8 hours |
| 15% HCl | 6 hours | 10 hours | 6 hours |

As evidenced in Table 2, the time to failure of sample 3b (Al 6061 coupon coated with 300 nm of $Hf_2Al_2O_7$ deposited by ALD) in any given HCl solution was longer than that of sample 3a (Al 6061 coupon coated with 500 nm of $Al_2O_3$ deposited by ALD) and of sample 3c (Al 6061 coupon coated with 500 nm of $Y_2Si_2O_7$ deposited by ALD), despite having a smaller thickness.

Example 4—HCl Immersion Test

The corrosion resistance of two hafnium aluminum oxide coatings deposited by ALD was compared to the corrosion resistance of an aluminum oxide coating deposited by ALD, based on a HCl immersion test. The following four samples were compared: 4a) a non-coated stainless steel coupon, 4b) a stainless steel coupon coated with about 100 nm of $HfAl_2O_5$ coating deposited by ALD, 4c) a stainless steel coupon coated with about 100 nm of $Hf_2Al_2O_7$ coating deposited by ALD, and 4d) a stainless steel coupon coated with about 100 nm of $Al_2O_3$ coating deposited by ALD.

These four samples were immersed in a 5% HCl solution at room temperature for about 12 hours. Thereafter, the samples were removed from the solution and were analyzed using inductively coupled plasma optical emission spectroscopy (ICP-OES) to detect the chemical elements in the samples. Table 3 below provides a summary of the ICP-OES analysis of samples 4a), 4b), 4c), and 4d).

TABLE 3

ICP-OES of 5 wt % HCl Solution After 12 Hours Immersion (ppm)

| Element | Sample 4a - Uncoated stainless steel | Sample 4b - 100 nm $HfAl_2O_5$ on stainless steel | Sample 4c - 100 nm $Hf_2Al_2O_7$ on stainless steel | Sample 4d - 100 nm $Al_2O_3$ On stainless steel |
|---|---|---|---|---|
| Al | <0.5 | <0.5 | <0.5 | 0.6 |
| Fe | 24 | <0.5 | <0.5 | 4.9 |
| Cr | 6.2 | <0.5 | <0.5 | 1.1 |
| Ni | 3.7 | <0.5 | <0.5 | 0.6 |

As evidenced in Table 3, hafnium aluminum oxide coatings (samples 4b and 4c) deposited by ALD enhanced the corrosion resistance of coated stainless steel coupons in HCl solution as compared to an aluminum oxide coating deposited by ALD (sample 4d) or as compared to a non-coated stainless steel surface (sample 4a).

Example 5—Scratch Adhesion

The scratch adhesion of a 300 nm $Hf_2Al_2O_7$ coating deposited by ALD on aluminum was measured by assessing the force (mN) that it would take expose the aluminum substrate using a 10 micron diamond stylus. The force was measured three times. The results are summarized in Table 4 below.

TABLE 4

Scratch Adhesion Test Results for 300 nm $Hf_2Al_2O_7$ Coating on Al

| Measurement # | Force (mN) |
|---|---|
| 1 | 53.15 |
| 2 | 53.62 |
| 3 | 48.20 |
| Average | 51.66 |

Example 6—Purity

Inductively coupled plasma mass spectrometry (ICP-MS) was performed on a hafnium aluminum oxide coating ($Hf_2Al_2O_7$) deposited by ALD to evaluate whether the coating included any trace elements (e.g., contaminants that diffused from the substrate and into the coating). The ICP-MS measurements showed that all of the following trace elements were undetectable (i.e., less than 0.05 ppm was present) in the $Hf_2Al_2O_7$ coating: Sb, As, Ba, Be, Bi, Br, Cd, Ca, Ce, Cs, Cr, Co, Cu, Dy, Er, Eu, Gd, Ga, Ge, Au, Ho, In, I, Ir, Fe, La, Pb, Li, Lu, Mg, Mn, Hg, Mo, Nd, Ni, Nb, Os, Pd, P, Pt, K, Pr, Re, Rh, Rb, Ru, Sm, Sc, Se, Ag, Na, Sr, Ta, Te, Tb, Tl, Th, Tm, Sn, Ti, W, U, V, Yb, Y, and Zn.

The ICP-MS data shows that the $Hf_2Al_2O_7$ coating contains a majority of aluminum and hafnium (and trace amounts of boron (23 ppm) and zirconium (160 ppm)). The ICP-MS data confirmed that the $Hf_2Al_2O_7$ coating has a very low surface contamination (i.e., a purity of about 99.98%) and successfully prevented diffusion of the trace elements from the underlying substrate into the ALD deposited coating.

Example 7—DCS (Dichlorosilane) Exposure

Corrosion of bare aluminum alloy Al6061 components exposed to halogen gases, such as DCS, and residual moisture caused metal contamination on wafers for ALD processing chambers. Three dimensional, conformal, dense, porosity-free, $Hf_2Al_2O_7$ coating acted as an effective and robust corrosion inhibitor. This was evidenced based on the metal contamination test results, summarized in Table 5 below. The metal contamination test results were obtained after exposing the uncoated part and the coated part (coated with $Hf_2Al_2O_7$ Coating) to DSC and to residual moisture for 45 min at about 150° C. to about 180° C., which equal to about 900 wafer processing cycles.

TABLE 5

Metal Contamination Test Results upon exposure to DSC and residual moisture for $Hf_2Al_2O_7$ Coating on Al

| Metal | Surface Concentration on Uncoated Part (atom/cm$^2$) | Uncoated Al Sleeve | Part coated with $Hf_2Al_2O_7$ |
|---|---|---|---|
| Al | 180e10 | 23e10 | All Splits < 1e10 |
| Cu | All Splits < 1e10 | 2.9e10 | All Splits < 1e10 |
| Ni | 2.4e10 | All Splits < 1e10 | All Splits < 1e10 |
| Ti | All Splits < 1e10 | All Splits < 1e10 | All Splits < 1e10 |
| K | All Splits < 1e10 | All Splits < 1e10 | All Splits < 1e10 |
| Na | All Splits < 1e10 | All Splits < 1e10 | All Splits < 1e10 |

As can be seen from Table 5, no metal contamination was observed upon exposure of a part coated with a $Hf_2Al_2O_7$ Coating to DCS. In contrast, an uncoated part exposed to DCS under the same conditions does result in metal contaminants thereon.

Example 8—Corrosion Resistance of a $Hf_2Al_2O_7$ Coating

Figure 6B:
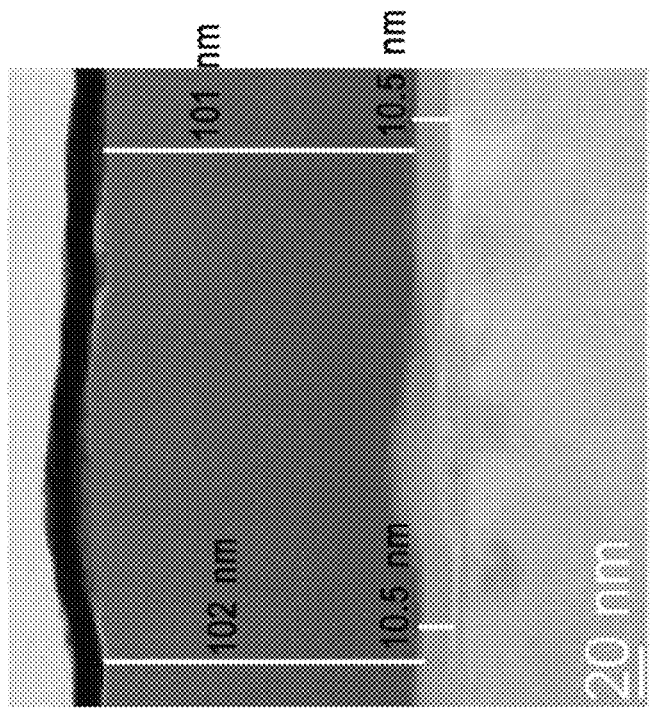
FIG. 6B is a transmission electron microscopy image of the $Hf_2Al_2O_7$ coating from FIG. 6A after the $Cl_2$ soak test at a 20 nm scale.
Figure 6A:
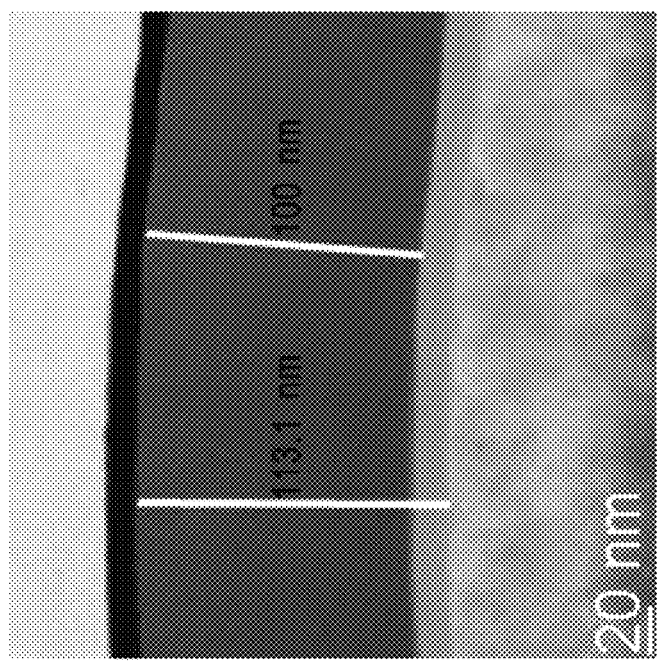
FIG. 6A is a transmission electron microscopy image of a $Hf_2Al_2O_7$ coating on an aluminum coupon before a $Cl_2$ soak test at a 20 nm scale.

An aluminum coupon was coated with a $Hf_2Al_2O_7$ coating and soaked in $Cl_2$ for about 25 hours at about 380° C. in vacuum chamber. As can be seen from the unchanged thickness of the $Hf_2Al_2O_7$ coating before the soak test (FIG. 6A) and after the soak test (FIG. 6B), no $Cl_2$ corrosion was observed on the $Hf_2Al_2O_7$ coating.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A coated processing chamber component, to be inserted into a processing chamber, comprising:
   a body;
   a buffer layer deposited on the body, the buffer layer consisting essentially of silicon dioxide or aluminum nitride; and
   a corrosion resistant coating, deposited on the buffer layer, comprising hafnium, aluminum, and oxygen and having a purity greater than about 99.95%, on a surface of the body, wherein the corrosion resistant coating comprises:
   a first layer and a second layer, wherein the first layer comprises a first plurality of monolayers, each of the first plurality of monolayers consisting essentially of aluminum oxide, and wherein the second layer comprises a second plurality of monolayers, each of the second plurality of monolayers consisting essentially of hafnium oxide,
   about 1 mol % to about 40 mol % of hafnium,
   about 1 mol % to about 40 mol % of aluminum, and
   about 20 mol % to about 98 mol % oxygen.

2. The coated processing chamber component of claim 1, wherein the corrosion resistant coating, at a thickness of about 300 nm, exhibits at least one of a) at least about 13 hours to failure tested according to a HCl bubble test conducted in 5% HCl solution, or b) at least about 10 hours to failure tested according to a HCl bubble test conducted in 15% HCl solution.

3. The coated processing chamber component of claim 1, wherein the corrosion resistant coating comprises about 10 mol % to about 20 mol % hafnium, about 15 mol % to about 30 mol % aluminum, and the remainder oxygen.

4. The coated processing chamber component of claim 1, wherein the corrosion resistant coating further comprises a homogenous mixture of hafnium and aluminum having an aluminum to hafnium molar ratio ranging from about 0.8 to about 2.5.

5. The coated processing chamber component of claim 1, wherein the corrosion resistant coating has a thickness of about 0.5 nm to about 1 μm.

6. The coated processing chamber component of claim 1, wherein the processing chamber component is selected from a group consisting of a chamber wall, a shower head, a nozzle, a plasma generation unit, a radiofrequency electrode, an electrode housing, a diffuser and a gas line.

7. The coated processing chamber component of claim 1, wherein the processing chamber component comprises a portion having a depth to width aspect ratio ranging from about 10:1 to about 200:1, and wherein the portion of the processing chamber component is coated with the corrosion resistant coating.

8. The coated processing chamber component of claim 1, wherein the body comprises a material that is at least one of aluminum, steel, silicon, copper or magnesium.

9. The coated processing chamber component of claim 1, wherein the corrosion resistant coating, at a thickness of about 100 nm, exhibits less pitting than a 100 nm thick aluminum oxide coating in a 6% $FeCl_3$ immersion test conducted at about 50° C. for about 12 hours.

10. The coated processing chamber component of claim 1, wherein the corrosion resistant coating is conformal, is amorphous, has a porosity of about 0%, and has a uniform thickness with thickness variations of less than about +/−5%.

11. The coated processing chamber component of claim 1, wherein the corrosion resistant coating, at a thickness of about 300 nm, takes a force of at least about 52 mN to expose the surface of the body using a 10 micron diamond stylus in a scratch adhesion test.

* * * * *